(12) United States Patent
DeJule et al.

(10) Patent No.: US 7,473,903 B2
(45) Date of Patent: Jan. 6, 2009

(54) METHOD AND APPARATUS FOR DEPOSITED HERMETIC COVER FOR DIGITAL X-RAY PANEL

(75) Inventors: Michael Clement DeJule, Clifton Park, NY (US); Ching-Yeu Wei, Niskayuna, NY (US); David Francis Fobare, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 724 days.

(21) Appl. No.: 10/365,093

(22) Filed: Feb. 12, 2003

(65) Prior Publication Data

US 2004/0155320 A1    Aug. 12, 2004

(51) Int. Cl.
    *G01T 1/20* (2006.01)
(52) U.S. Cl. .................... 250/370.11; 378/37
(58) Field of Classification Search ............ 250/370.11; 378/37
    See application file for complete search history.

(56) References Cited

U.S. PATENT DOCUMENTS

| | | | |
|---|---|---|---|
| 5,179,284 A * | 1/1993 | Kingsley et al. | ....... 250/370.11 |
| 5,187,369 A | 2/1993 | Kingsley et al. | |
| 5,231,654 A | 7/1993 | Kwasnick et al. | |
| 5,231,655 A | 7/1993 | Wei et al. | |
| 5,293,417 A | 3/1994 | Wei et al. | |
| 5,303,282 A | 4/1994 | Kwasnick et al. | |
| 5,399,884 A | 3/1995 | Wei et al. | |
| 5,430,298 A | 7/1995 | Possin et al. | |
| 5,435,608 A | 7/1995 | Wei et al. | |
| 5,463,225 A | 10/1995 | Kwasnick et al. | |
| 5,516,712 A | 5/1996 | Wei et al. | |
| 5,517,031 A | 5/1996 | Wei et al. | |
| 5,585,280 A | 12/1996 | Kwasnick et al. | |
| 6,037,609 A | 3/2000 | Liu et al. | |
| 6,167,110 A | 12/2000 | Possin et al. | |
| 6,172,371 B1 * | 1/2001 | DeJule et al. | .......... 250/370.11 |
| 6,225,212 B1 | 5/2001 | Liu et al. | |
| 6,350,990 B1 * | 2/2002 | Wei et al. | ................ 250/370.11 |
| 6,353,654 B1 | 3/2002 | Granfors et al. | |
| 6,359,291 B1 | 3/2002 | Liu et al. | |
| 6,392,254 B1 | 5/2002 | Liu et al. | |
| 6,396,046 B1 | 5/2002 | Possin et al. | |
| 6,414,315 B1 | 7/2002 | Wei et al. | |
| 6,465,861 B1 | 10/2002 | Liu et al. | |
| 6,642,524 B2 * | 11/2003 | Vafi et al. | ............... 250/370.11 |
| 6,833,548 B2 * | 12/2004 | Homme et al. | ......... 250/370.11 |

* cited by examiner

*Primary Examiner*—Christine Sung
(74) *Attorney, Agent, or Firm*—Fletcher Yoder

(57) ABSTRACT

A digital X-ray panel and method of fabricating an X-ray detector panel assembly is provided. The method includes forming a detector matrix on the detector substrate, forming a dam on the detector substrate circumscribing the detector matrix, forming a scintillator material on the detector matrix, and forming a hermetic covering on the scintillator material that at least one of extends to a surface of the dam and extends past the dam. The digital X-ray panel assembly includes a detector substrate, a detector matrix formed on said detector substrate, a dam formed on said detector substrate circumscribing the detector matrix, a scintillator material formed on the detector matrix, and a hermetic covering formed on the scintillator material that at least one of extends past the detector matrix and the dam, and extends past the detector matrix onto a surface of the dam.

15 Claims, 6 Drawing Sheets

METHOD AND APPARATUS FOR DEPOSITED HERMETIC COVER FOR DIGITAL X-RAY PANEL

BACKGROUND OF THE INVENTION

The present invention generally relates to digital imaging systems and more particularly to the fabrication of X-ray detector assemblies.

Digital X-ray imaging systems are becoming increasingly widespread for producing digital data, which can be reconstructed into useful radiographic images. In some known digital X-ray imaging systems, radiation from a source is directed toward a subject, such as a patient in a medical diagnostic application. A portion of the radiation passes through the patient and impacts a detector wherein the detector converts the radiation to light photons, which are sensed. The detector is divided into a matrix of discrete picture elements or pixels, and encodes output signals based upon the quantity or intensity of the radiation impacting each pixel region. Because the radiation intensity is altered as the radiation passes through the patient, the images reconstructed based upon the output signals provide a projection of the patient's tissues similar to those available through conventional x-ray photographic film techniques.

An important factor in medical imaging applications is a detector spatial resolution. Photons, which are generated in a scintillator material over one detector pixel, need to be counted only by that underlying pixel to obtain a high image resolution. Photons that are scattered to adjacent pixels reduce the clarity of the image. Therefore scintillator material is vapor deposited in columnar or needle form. Individual needles are separated from one another and possess aspect ratios (length/diameter) of about 100 or greater. Photons traveling down the scintillator needles tend to be contained within the individual needle due to the higher refractive index of scintillator material over air, provided that the individual scintillator needles remain separated. A Cesium Iodide (CsI) scintillator material is known to be a hydroscopic salt. Exposure of CsI scintillator material to moisture can cause the CsI scintillator material to absorb moisture, which further causes the individual CsI scintillator needles to coalesce or fuse together.

Transportation, storage and operation of radiation imaging equipment may expose the equipment to adverse environmental conditions, such as moisture from atmospheric humidity and splash during operation and shipping. Such environmental conditions have the potential to damage the radiation imaging equipment. For example, such imagers include a scintillator, which converts radiation into visible light, that may experience coalescence under such conditions, resulting in image degradation, potentially rendering the radiation imager unusable. The term "coalescence" refers to crystals of the scintillator growing together due to moisture absorption. Once coalescence begins, it may further spread beyond the initial point or area of damage.

BRIEF DESCRIPTION OF THE INVENTION

In one aspect, a method of fabricating an X-ray detector panel assembly is provided. The assembly includes a detector substrate that includes a detector base surface and a plurality of sidewalls extending perpendicularly away from the detector base surface. The method includes forming a detector matrix on the detector substrate, forming a dam on the detector substrate circumscribing the detector matrix, forming a scintillator material on the detector matrix, and forming a hermetic covering on the scintillator material that at least one of extends to a surface of the dam and extends past the dam.

In another aspect, a digital X-ray panel assembly is provided. The digital X-ray panel assembly includes a detector substrate, a detector matrix formed on said detector substrate, a dam formed on said detector substrate circumscribing the detector matrix, a scintillator material formed on the detector matrix, and a hermetic covering formed on the scintillator material that at least one of extends past the detector matrix and the dam, and extends past the detector matrix onto a surface of the dam.

DETAILED DESCRIPTION OF THE INVENTION

Figure 1:
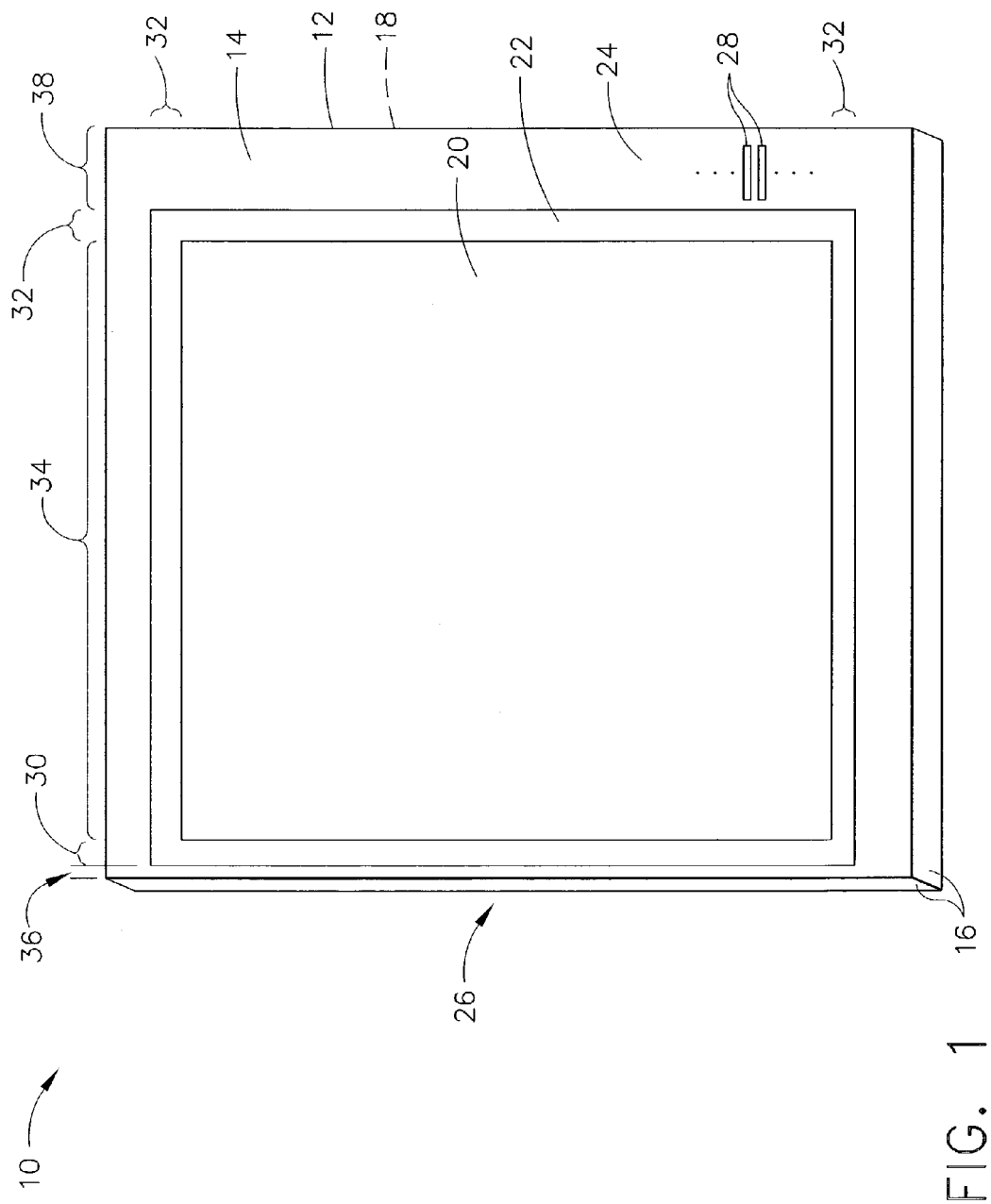
FIG. 1 is a plan view of a digital X-ray panel.

FIG. 1 is a plan view of a digital X-ray panel 10 that includes a rectangularly shaped detector substrate 12 that includes a detector base surface 14, at least one sidewall 16 that extends perpendicularly away from detector base surface 14 and a backside 18 that opposes detector base surface 14. Detector base surface 14 includes an active detector area 20, a dam area 22, a contact fingers area 24 and a chest wall side 26.

Active detector area 20 is a substantially rectangular area on a detector base surface 14 that is responsive to incident radiation and configured to convert incident radiation to electrical signals which are received at a plurality of contact fingers 28 spaced on contact fingers area 24. Dam area 22 includes a planarized adhesive coating that surrounds active detector area 20. In the exemplary embodiment, panel 10 is used with a mammogram machine. Accordingly, a chest wall side portion of dam area 22 includes a width 30 and portions of dam area 22 that are not adjacent to chest wall side 26 include a width 32. In one embodiment, width 30 is in a range of between 0.015 inches and 0.055 inches. In an alternative embodiment, width 30 is in a range of between 0.025 inches and 0.045 inches. In the exemplary embodiment, width 30 is approximately 0.035 inches. In one embodiment, width 32 is in a range of between 0.138 inches and 0.178 inches. In an alternative embodiment, width 32 is in a range of between 0.148 inches and 0.168 inches. In the exemplary embodiment, width 32 is approximately 0.158 inches. The thickness range is provided for illustration purposes and is not intended to suggest a limitation.

In the exemplary embodiment, a dimension of width 30 is less than a dimension of width 32. For example, this configuration could be used when digital X-ray panel 10 is to be used in a mammogram machine where it is desirable to get active detector area 20 as close to a patient's chest wall as possible.

In an alternative embodiment, such as, for example, a RAD or cardiac machine, the dimension of width 30 may be one of equal to and greater than the dimension of width 32. A width 34 is a width of active detector area 20, a width 36 is a width of substrate 12 adjacent chest wall side 26 and a width 38 is a width of contact fingers area 24 not adjacent to chest wall side 26. Contact fingers 28 do not exit panel 10 at chest wall side 26. In one embodiment, width 36 is substantially zero, meaning dam 106 in area 30 extends substantially to an edge of substrate 12.

In operation, a portion of the patient is positioned between digital X-ray panel 10 and a radiation or x-ray source (not shown). Incident radiation passes through the patient and a portion of the incident radiation is absorbed by the patient. The portion of incident radiation that is not absorbed by the patient is substantially absorbed by scintillator material 110. Scintillator material 110 converts the x-ray signal into a light signal which in-turn is converted into electrical charge by a photodiode on the detector substrate. Thus, the electrical signal is proportional to an amount of radiation received by digital X-ray panel 10. The electrical signals are presented to contact fingers 28 for further coupling to an interpretive electronics device (not shown).

Figure 2:
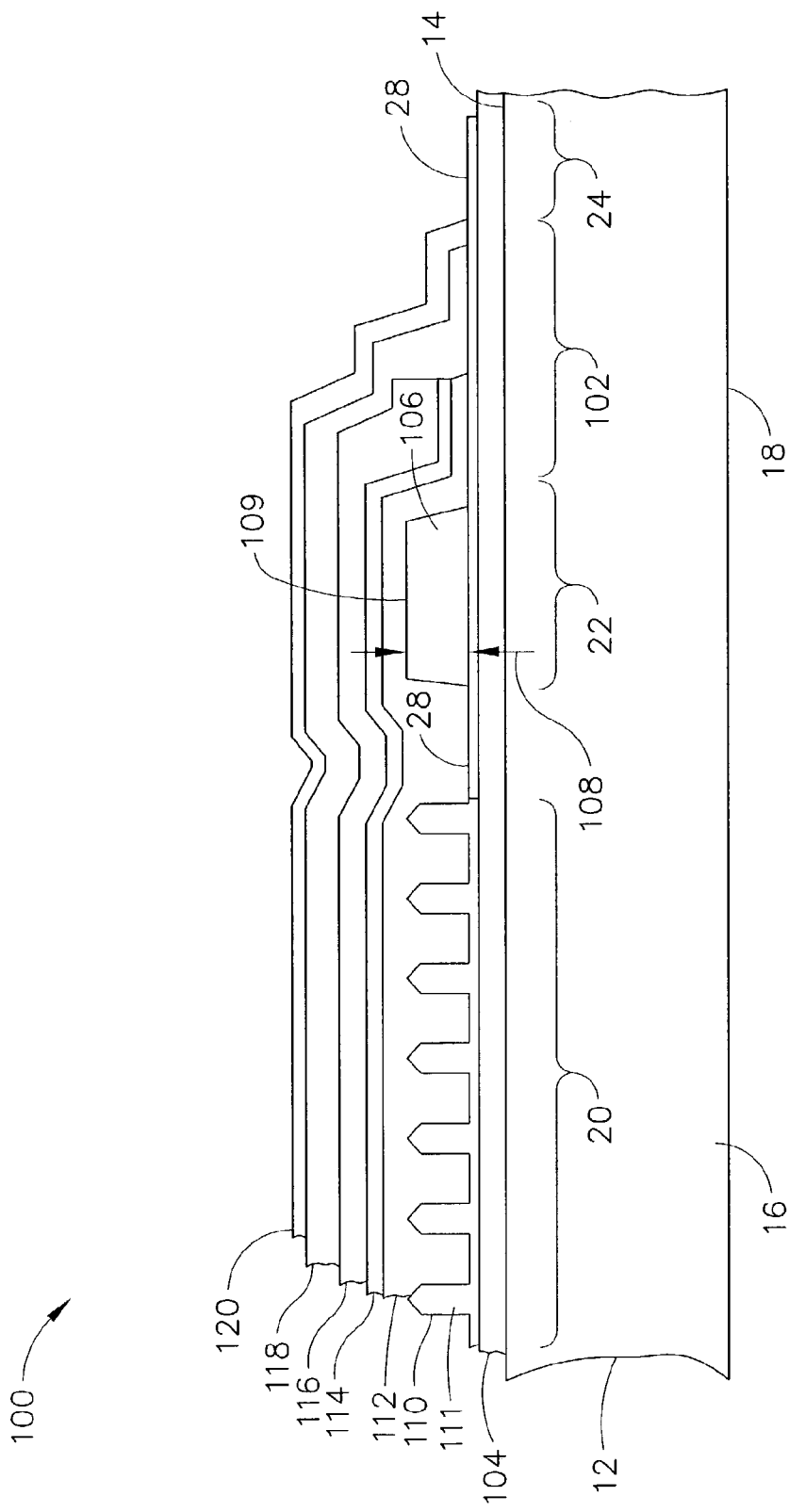
FIG. 2 is a cross-sectional view of a hermetic seal configuration that may be used with the X-ray detector panel shown in FIG. 1.

FIG. 2 is a cross-sectional view of a hermetic seal configuration that may be used with the X-ray detector panel shown in FIG. 1. Components shown in FIG. 2 that are identical to components shown in FIG. 1 are identified in FIG. 2 with the same numerals as used in FIG. 1. Accordingly, detector substrate 12 includes detector base surface 14, sidewall 16 that extends perpendicularly away from detector base surface 14 and a backside 18 that opposes detector base surface 14.

Detector base surface 14 includes an active detector area 20, a dam area 22, a contact fingers area 24, and an adhesion area 102. A detector matrix 104 that includes an array of photosensors positioned to detect photons is formed on detector base surface 14 within active detector area 20. Elements of detector matrix 104 are electrically coupled to contact fingers 28 such that through a combination of connections to contact fingers 28, the status of each element of detector matrix 104 can be determined. A planarized adhesive dam 106 is formed around the perimeter of active detector area 20 and includes a thickness 108, which is a distance from a first side of dam 106 that is adjacent to detector matrix 104 to an opposing second surface 109 of dam 106. In the exemplary embodiment, thickness 108 is about 0.005 inches. As noted herein, terms such as, for example, "on", "over", and "above" are used to refer to relative locations of items illustrated in the drawings and do not imply structural or operational limitations in the assembled device.

A scintillator material 110 is formed on detector matrix 104 covering active detector area 20. In the exemplary embodiment, scintillator material 110 includes a Cesium Iodide (CsI) material in a CsI needle structure 111. In an alternative embodiment, other scintillator materials would also be acceptable. In the exemplary embodiment CsI needle structure 111 includes a thallium doping material. An encapsulating layer 112 is formed over scintillator material 110 that extends over active detector area 20, dam area 22 and a portion of adhesion area 102. In the exemplary embodiment, encapsulating layer 112 is deposited between scintillator needle structure 111 all the way to the bottom of each of the scintillator needles 111 and along all of the sidewalls of all of the scintillator needles. Adhesion area 102 provides an area for encapsulating layer 112 to bind to for forming a seal over scintillator material 110. In one embodiment encapsulating layer 112 is coating is poly-para-xylylene material (Parylene™ N). In another embodiment, encapsulating layer 112 is coating ismono-chloro-poly-para-xylylene material (Parylene™ C). In another embodiment, encapsulating layer 112 is coating is both Parylene™ C and Parylene™ N. Parylene™ is a trademark of Specialty Coating Systems, Inc. 5701 West Minnesota St. Indianapolis, Ind. 46241.

A reflective layer 114 including for example, silver, gold, titanium dioxide, or aluminum is formed over encapsulating layer 112 and extends to the edges of encapsulating layer 112 over adhesion area 102. In the exemplary embodiment, reflective layer 114 extends to the edge of encapsulating layer 112. In other embodiments, reflective layer 114 does not extend to the edge of encapsulating layer 112 and overruns the edge of encapsulating layer 112.

A thin film mask 116 including a relatively low atomic weight material such as, for example, aluminum (Al), magnesium fluoride (MgF), diamond-like carbon, boron carbide ($B_4C$), boron nitride ($BNO_2$), silicon nitrate ($SiNO_3$), and silicon oxide (SiO) is formed on reflective layer 114. Thin film mask 116 resists plasma etching. In one embodiment thin film mask 116 is not used such as when reflective layer 114 is not removed during a reactive ion etch (RIE) process. In another embodiment, a thin barrier layer (not shown) may be formed between reflective layer 114 and thin film mask 116 such as when reflective layer 114 includes silver and thin film mask 116 includes aluminum. In such a case, the silver and aluminum may tend to diffuse together and a thin barrier layer, in-between, including, for example, chrome facilitates reducing this diffusion.

A hermetic layer 118 is formed on thin film mask 116. Hermetic layer 118 also includes a relatively low atomic weight material such as, for example, aluminum (Al), magnesium fluoride (MgF), diamond-like carbon, boron carbide ($B_4C$), boron nitride ($BNO_2$), silicon nitrate ($SiNO_3$), and silicon oxide (SiO). Hermetic layer 118 is formed on thin film mask 116 so as to extend over and terminate on adhesion area 102 adjacent to encapsulating layer 112. Hermetic layer 118 and adhesion area 102 provide a humidity barrier. A corrosion protection layer 120 is formed on hermetic layer 118 so as to terminate on adhesion area 102 adjacent to hermetic layer 118. Corrosion protection layer 120 includes materials that have a low X-ray absorption such as, for example, acrylic, Parylene™, aluminum (Al), aluminum oxide (AlO), magnesium fluoride (MgF), diamond-like carbon, boron carbide ($B_4C$), boron nitride ($BNO_2$), silicon nitrate ($SiNO_3$), silicon oxide (SiO), and gold (Au).

Digital X-ray panel 10 is fabricated as follows: Active area 20 of digital x-ray panel 10 is manufactured with thousands of contact fingers 28 located around the perimeter of substrate 12. An adhesive material is deposited on the detector substrate 12 in dam area 22. In one embodiment of the present invention the adhesive material is an epoxy material. In one embodiment of the present invention the encapsulating coating 112 is at least one of Parylene™N, Parylene™ C, and a combination thereof.

The epoxy material is planarized with a Teflon™, (a trademark of the E. I. du Pont de Nemours and Company 1007 Market Street, Wilmington, Del. 19898), planarizing fixture (not shown) to form a planarized adhesive dam 106 that has a thickness 108 in a range between about 0.004 inches and about 0.006 inches. Thickness 108 range is provided for illustration purposes and is not intended to suggest a limitation. The planarizing fixture is removed after planarized adhesive dam 106 has cured. A metal alloy Kovar™ (a trademark of the CRS Holdings, Inc. 209 Baynard Building 3411 Silverside Road, Wilmington, Del. 19810), (29% Ni, 53% Fe, 17% Co and 1% trace impurities) shadow mask (not shown) is laid down on planarized adhesive dam 106, so that metal alloy shadow mask covers contact fingers 28 and one edge of the metal alloy Kovar™ shadow mask does not extend past a periphery of the detector matrix 104 closest to the contact fingers 28.

Scintillator material 110 is deposited through metal alloy shadow mask and onto detector substrate 12 and is in contact with detector matrix 104 on detector substrate 12. During deposition of scintillator material 110 on substrate 12, contact fingers 28 are protected from being coated with scintillator material 110 by planarized adhesive dam 106 which is deposited on substrate 12 between contact fingers 28 and active area 20 to be coated with scintillator material 110. A contact shadow mask is then placed on top of dam 106 during scintillator material 110 deposition. A window in a center of the shadow mask allows scintillator material 110 to only be deposited in active area 20 and not on contact fingers 28. Dam 106 and the shadow mask protect contact fingers 28 from being deposited with scintillator material 110.

The metal alloy shadow mask is removed. Encapsulating layer 112 is deposited on scintillator material 110, including coating between and along scintillator needle structure 111. Encapsulating layer 112 is also deposited on dam area 22, adhesion area 102, planarized adhesive dam 106 and contact fingers 28. A contact shadow mask (not shown) is then laid down on encapsulating layer 112 on planarized adhesive dam 106, so that the contact shadow mask covers contact fingers 28 and one edge of the contact shadow mask does not extend over dam area 22. Reflective layer 114 is deposited onto encapsulating layer 112 covering scintillator material 110, planarized adhesive dam 106 and adhesion area 102. In one embodiment, reflective layer 114 is deposited onto only a portion of adhesion area 102.

Thin film mask 116 is then deposited on reflective layer 114. Thin film mask 116 protects reflective layer 114 when encapsulating layer 112 is removed by an oxygen RIE. The contact shadow mask is then removed. Encapsulating layer 112 has been removed with RIE from contact fingers 28. A hermetic layer contact shadow mask (not shown) is then laid so that the shadow mask covers contact fingers 28 and one edge of hermetic layer contact shadow mask does not extend over a portion of adhesion area 102. Hermetic layer 118 is deposited on thin film mask 116 and hermetic layer 118 terminates on adhesion area 102 adjacent to thin film mask 116 so as to form humidity barrier between hermetic layer 118 and adhesion area 102. An optional corrosion protection layer 120 is deposited on hermetic layer 118 and corrosion protection layer 120 terminates on adhesion area 102 adjacent to hermetic layer 118.

Hermetic layer 118 and corrosion protection layer 120 make up a hermetic covering for panel 10. When optional corrosion protection layer 120 is not used, hermetic layer 118 is chosen from a material that does not readily corrode and serves both as a hermetic layer and a corrosion protection layer.

Figure 3:
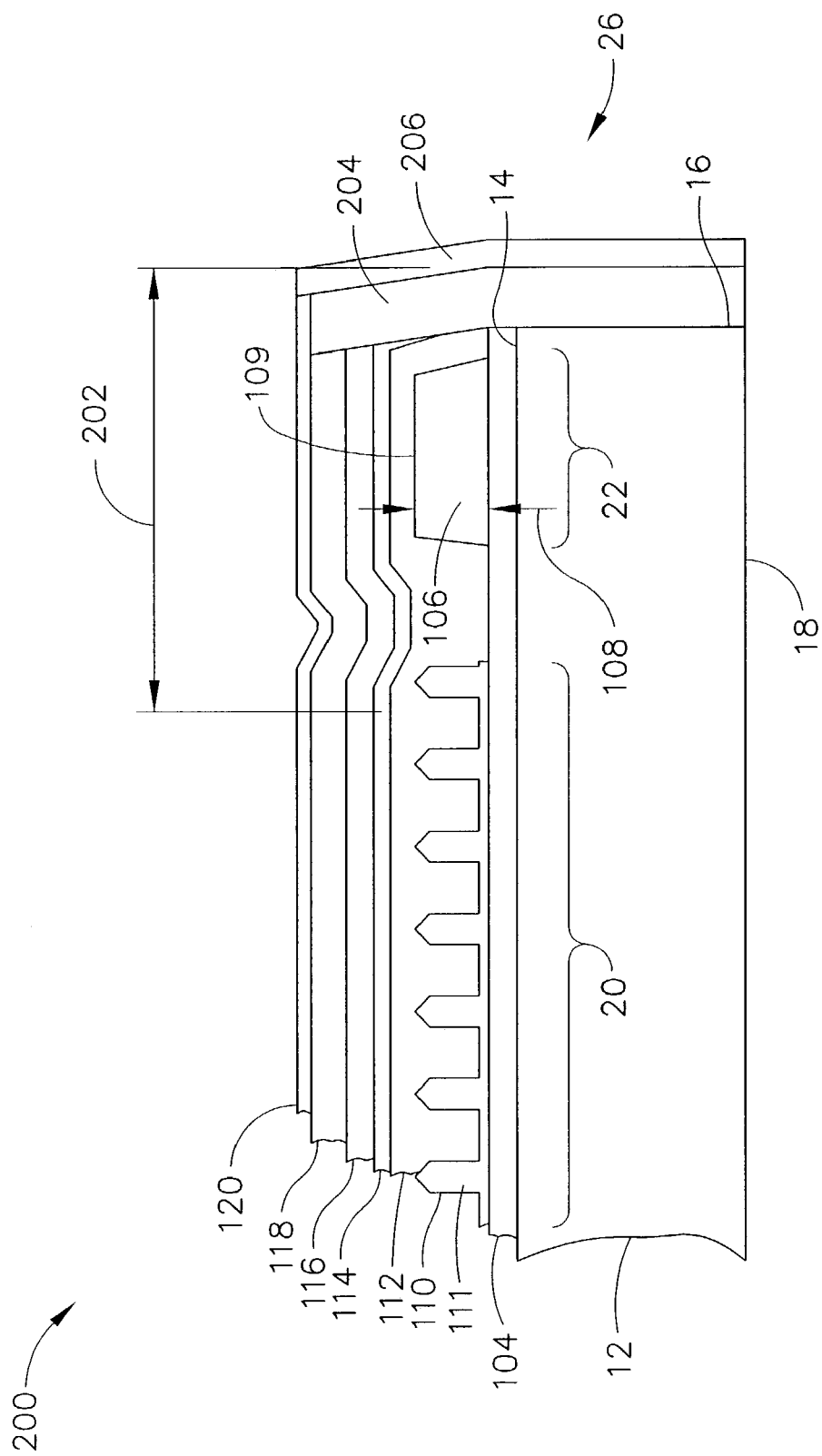
FIG. 3 is a cross-sectional view of an alternative hermetic seal configuration that may be used with the X-ray detector panel shown in FIG. 1.

FIG. 3 is a cross-sectional view of an alternative hermetic seal configuration 200 that may be used with X-ray detector panel 10 shown in FIG. 1. Components shown in FIG. 3 that are identical to components shown in FIGS. 1 and 2 are identified in FIG. 3 with the same numerals as used in FIGS. 1 and 2. Accordingly, detector substrate 12 includes detector base surface 14, sidewall 16 that extends perpendicularly away from detector base surface 14 and a backside 18 that opposes detector base surface 14.

Hermetic seal configuration 200 facilitates reducing a width 202. This configuration is used to facilitate getting active detector area 20 as close to chest wall side 26 as is possible, for example, in a digital X-ray panel 10 that is used in a mammogram machine. X-ray detector panel 10 is fabricated similarly in configuration 200 as it is in configuration 100 except a hermetic layer 204 and corrosion protection layer 206 are deposited at a right angle to hermetic layer 118 and corrosion protection layer 120, for example from the right-hand side as shown in FIG. 3. Hermetic layer 204 is formed over an edge of encapsulating layer 112, reflective layer 114, thin film mask 116, hermetic layer 118, and corrosion protection layer 120, and sidewall 16 on chest wall side 126.

Figure 4:
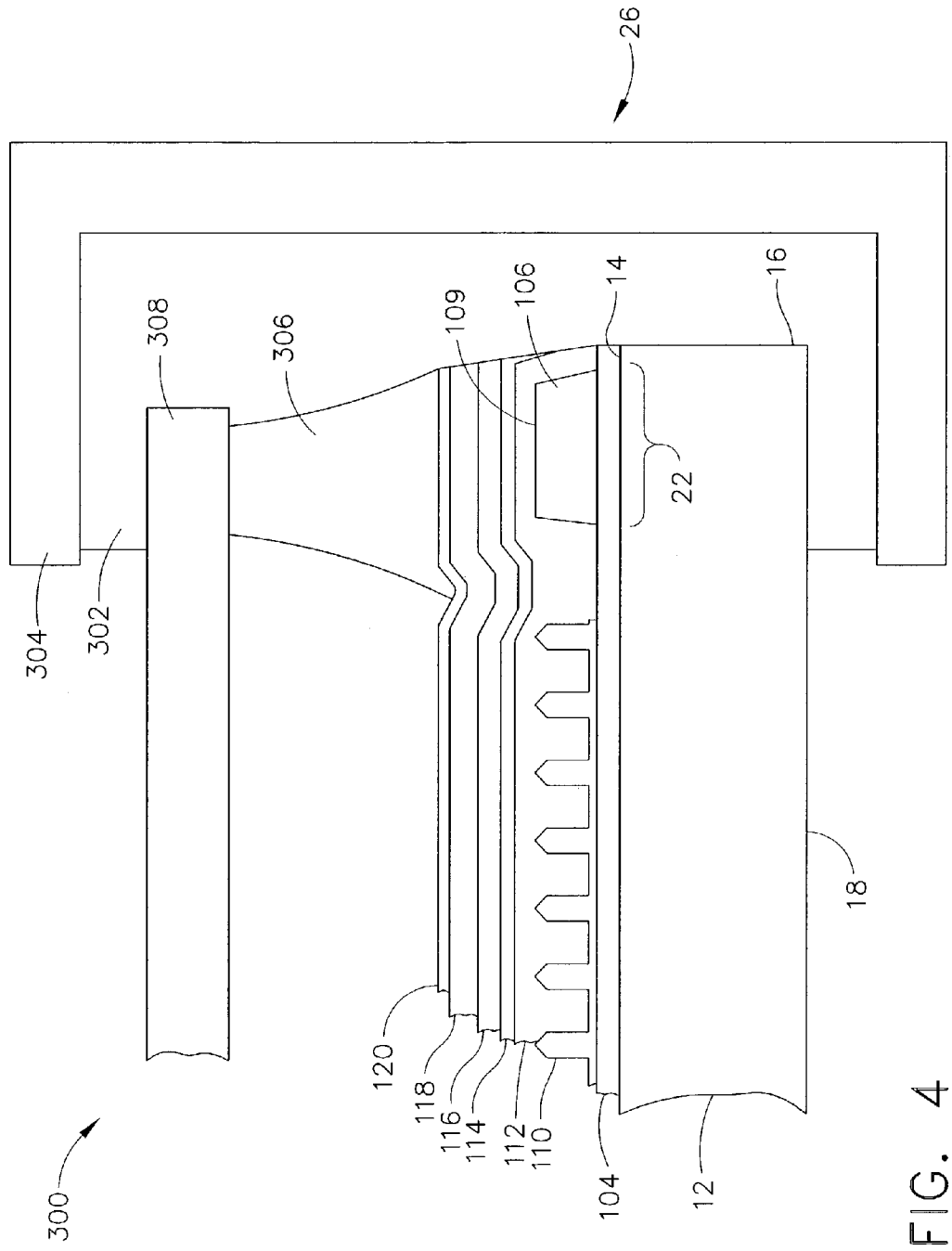
FIG. 4 is a cross-sectional view of another alternative hermetic seal configuration that may be used with the X-ray detector panel shown in FIG. 1.

FIG. 4 is a cross-sectional view of an alternative hermetic seal configuration 300 that may be used with X-ray detector panel 10 shown in FIG. 1. Components shown in FIG. 4 that are identical to components shown in FIGS. 1 and 2 are identified in FIG. 4 with the same numerals as used in FIGS. 1 and 2. Accordingly, detector substrate 12 includes detector base surface 14, sidewall 16 that extends perpendicularly away from detector base surface 14 and a backside 18 that opposes detector base surface 14.

Hermetic seal configuration 300 is fabricated similarly to hermetic seal configuration 100 and hermetic seal configuration 200 shown in FIGS. 2 and 3, respectively. Instead of a seal formed of hermetic layer 204 and corrosion protection layer deposited perpendicularly to hermetic layer 118 and corrosion protection layer 120, the embodiment shown in FIG. 4 uses an adhesive sealant 302 and an end channel 304 to seal chest wall side 26 of digital X-ray panel 10. In the exemplary embodiment, chest wall side 26 is the only side of digital X-ray panel 10 that is sealed using end channel 304, the other sides may be sealed according to the embodiments shown in FIG. 2.

An adhesive material 306 is applied to corrosion protection layer 120 in sufficient quantity to support and adhere a protective cover 308 to corrosion protection layer 120 such that there remains a gap between protective cover 308 and corrosion protection layer 120. In the exemplary embodiment, protective cover 308 includes a graphite/resin core, encapsulated by an aluminum foil. In an alternative embodiment, wherein corrosion protection layer 120 is not used, adhesive material 306 is applied to hermetic layer 118. Adhesive sealant 302 is applied to chest wall side 26 in sufficient quantity to fill a void between digital X-ray panel 10 components including adhesive sealant 306 and protective cover 308, and end channel 304.

Figure 5:
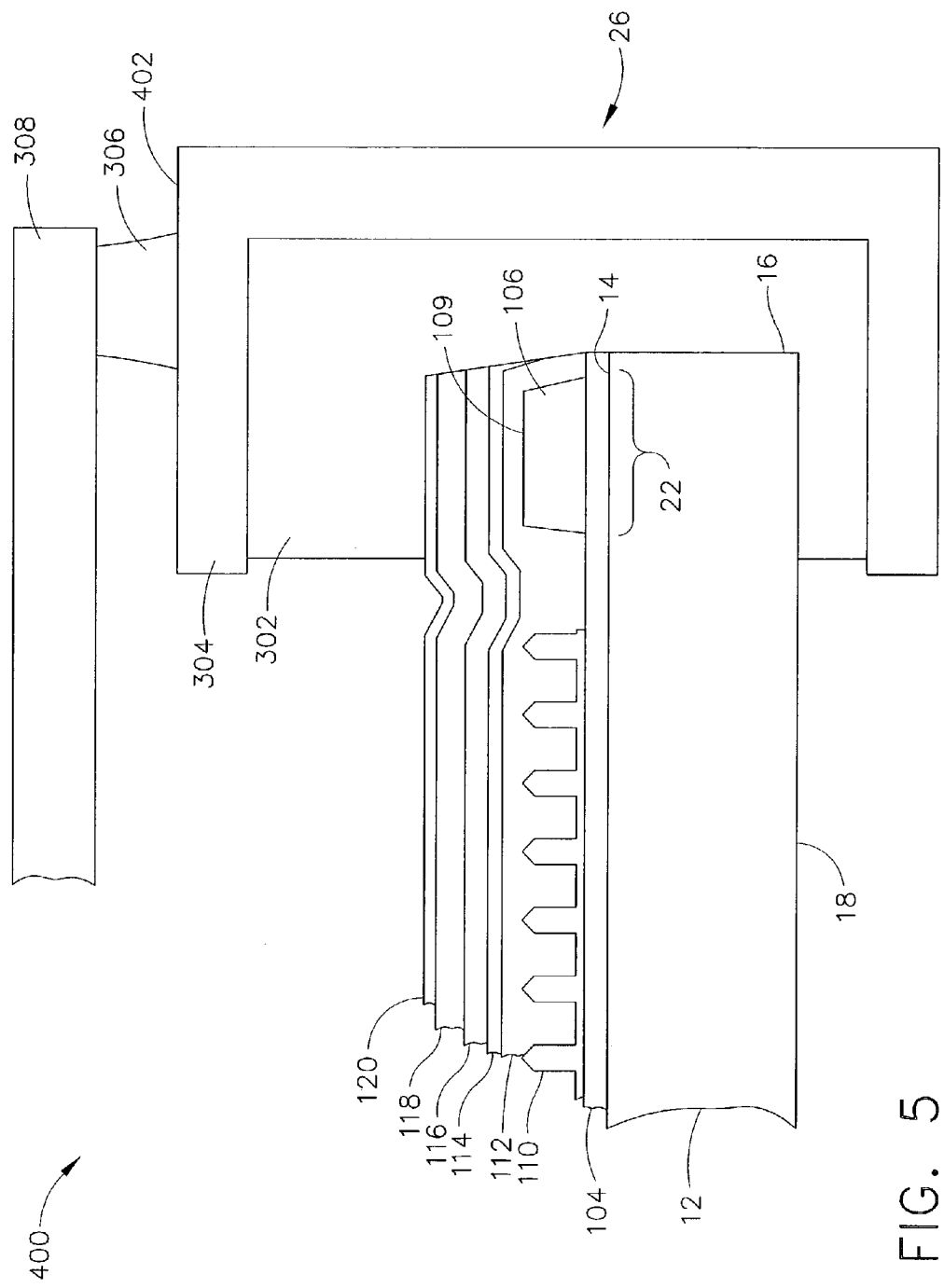
FIG. 5 is a cross-sectional view of yet another alternative hermetic seal configuration that may be used with the X-ray detector panel shown in FIG. 1.

FIG. 5 is a cross-sectional view of an alternative hermetic seal configuration 400 that may be used with X-ray detector panel 10 shown in FIG. 1. Components shown in FIG. 5 that are identical to components shown in FIGS. 1, 2, 3, and 4 are identified in FIG. 5 with the same numerals as used in FIGS. 1, 2, 3, and 4. Accordingly, detector substrate 12 includes detector base surface 14, sidewall 16 that extends perpendicularly away from detector base surface 14 and a backside 18 that opposes detector base surface 14.

Hermetic seal configuration 400 is fabricated similarly to hermetic seal configuration 300 shown in FIG. 4. Instead of protective cover 308 being positioned within end channel 304 as in FIG. 4, protective cover 308 is shown in FIG. 5 positioned outside an exterior surface 402 of end channel 304.

Adhesive sealant 302 is applied to chest wall side 26 in sufficient quantity to fill a void between digital X-ray panel 10 components and end channel 304. Adhesive material 306 is applied to surface 402 in sufficient quantity to support and adhere protective cover 308 to end channel exterior surface 402. Protective cover 308 is positioned to cover corrosion protection layer 120 or hermetic layer 118 when corrosion protection layer is not used.

Figure 6:
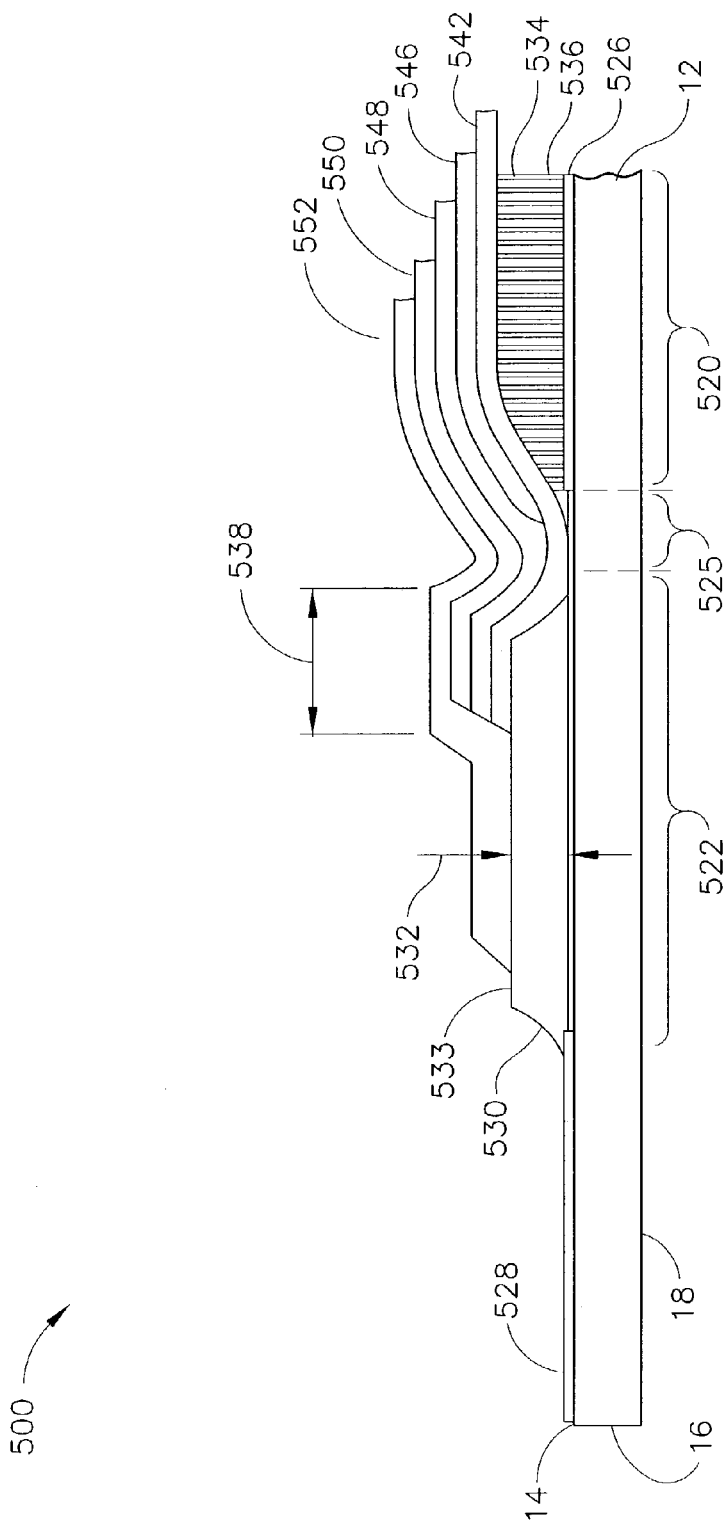
FIG. 6 is a cross-sectional view of still another alternative hermetic seal configuration that may be used with the X-ray detector panel shown in FIG. 1.

FIG. 6 is a cross-sectional view of another alternative hermetic seal configuration 500 that may be used with X-ray detector panel 10 shown in FIG. 1. Hermetic seal configuration 500 is fabricated similarly to hermetic seal configuration 100 shown in FIG. 2. Components shown in FIG. 6 that are identical to components shown in FIG. 1 are identified in FIG. 6 with the same numerals as used in FIG. 1. Accordingly, detector substrate 12 includes detector base surface 14, sidewall 16 that extends perpendicularly away from detector base surface 14 and a backside 18 that opposes detector base surface 14.

Detector base surface 14 includes an active detector area 520, a dam area 522, a contact fingers area 524, and a clearance area 525, between area 520 and dam area 522. A detector matrix 526 that includes an array of photo-sensors positioned to detect photons is formed on detector base surface 14 within active detector area 520. Elements of detector matrix 526 are electrically coupled to contact fingers 528 such that through a combination of connections to contact fingers 528, the status of each element of detector matrix 526 can be determined. A planarized adhesive dam 530 is formed around the perimeter of active detector area 520 and includes a thickness 532, which is a distance from a first side of dam 530 that is adjacent to detector matrix 526 to an opposing second surface 533 of dam 530. In one embodiment, thickness 532 is in a range of between 0.003 inches and 0.007 inches thick. In an alternative embodiment, thickness 532 is in a range of between 0.004 inches and 0.006 inches thick. In the exemplary embodiment, thickness 532 is about 0.005 inches. As noted herein, terms such as, for example, "on", "over", and "above" are used to refer to relative locations of items illustrated in the drawings and do not imply structural or operational limitations in the assembled device.

A scintillator material 534 is formed on detector matrix 526 covering active detector area 520. In the exemplary embodiment, scintillator material 534 includes a Cesium Iodide (CsI) material in a CsI needle structure 536. In an alternative embodiment, other scintillator materials would also be acceptable. In the exemplary embodiment CsI needle structure 536 includes a thallium doping material. A first encapsulating layer 542 is formed over scintillator material 534 that extends over active detector area 520, clearance area 525, and a portion of dam area 522 a distance 538. In the exemplary embodiment, encapsulating layer 542 is deposited between scintillator needle structure 536 all the way to the bottom of each of scintillator needles 536 and along all of the sidewalls of all of scintillator needles 536. In one embodiment, encapsulating layer 542 is in a range of between approximately 2.0 micrometers and 5.0 micrometers thick. In another embodiment, encapsulating layer 542 is in a range of between approximately 2.75 micrometers and 4.25 micrometers thick. In the exemplary embodiment, encapsulating layer 542 is approximately 3.5 micrometers thick. The thickness range is provided for illustration purposes and is not intended to suggest a limitation. In one embodiment encapsulating layer 542 includes poly-para-xylylene material (Parylene™ N). In another embodiment, encapsulating layer 542 includes ismono-chloro-poly-para-xylylene material (Parylene™ C). In another embodiment, encapsulating layer 542 includes is both Parylene™ C and Parylene™ N. Parylene™ is a trademark of Specialty Coating Systems, Inc. 5701 West Minnesota St. Indianapolis, Ind. 46241.

A reflective layer 546 including for example, silver or gold, titanium dioxide, and aluminum is formed over encapsulating layer 542 and extends to clearance area 525. In the exemplary embodiment, reflective layer 546 includes a layer of silver, a layer of titanium dioxide, and a layer of aluminum 0.5 micrometers thick. In one embodiment, the layer of silver is in a range of between approximately. 1,000 angstroms thick and 2,000 angstroms thick thick. In another embodiment, the layer of silver is in a range of between approximately 1,250 angstroms thick and 1,750 angstroms thick. In the exemplary embodiment, the layer of silver is approximately 1,500 angstroms thick. In one embodiment, the layer of titanium dioxide is in a range of between approximately 300 angstroms thick and 700 angstroms thick. In another embodiment, the layer of titanium dioxide is in a range of between approximately 400 angstroms thick and 600 angstroms thick. In the exemplary embodiment, the layer of titanium dioxide is approximately 500 angstroms thick. In one embodiment, the layer of aluminum is in a range of between approximately 0.3 micrometers thick and 0.7 micrometers thick. In another embodiment, the layer of aluminum is in a range of between approximately 0.4 micrometers thick and 0.6 micrometers thick. In the exemplary embodiment, the layer of aluminum is approximately 0.5 micrometers thick. The thickness range is provided for illustration purposes and is not intended to suggest a limitation. The layers of reflective layer 546 are sized to facilitate reflecting incident light from scintillator material 534 back into scintillator needles 536. The layers of silver and aluminum, over time, may tend to diffuse together and a thin barrier layer, in-between, including, for example, titanium facilitates reducing this diffusion. Reflective layer 546 covers encapsulating layer 542 over area 520 and extends over a portion of clearance area 525.

A second encapsulating layer 548 is formed on reflective layer 546. Encapsulating layer 548 is substantially similar to encapsulating layer 542 and also includes Parylene™. Layer 548 covers layer 546 and extends past the edge of layer 546 to the edge of layer 542 on dam 530. In one embodiment, encapsulating layer 548, is in a range of between approximately five micrometers thick and nine micrometers thick. In another embodiment, encapsulating layer 548 is in a range of between approximately six micrometers thick and eight micrometers thick. In the exemplary embodiment, encapsulating layer 548 is approximately seven micrometers thick. The thickness range is provided for illustration purposes and is not intended to suggest a limitation.

A moisture barrier layer 550 is deposited on layer 548. In the exemplary embodiment, layer 550 includes a layer of titanium dioxide and a layer of aluminum. In one embodiment, the layer of titanium dioxide is in a range of between approximately 300 angstroms thick and 700 angstroms thick. In another embodiment, the layer of titanium dioxide is in a range of between approximately 400 angstroms thick and 600 angstroms thick. In the exemplary embodiment, the layer of titanium dioxide is approximately 500 angstroms thick. In one embodiment, the layer of aluminum is in a range of between approximately 0.3 micrometers thick and 0.7 micrometers thick. In another embodiment, the layer of aluminum is in a range of between approximately 0.4 micrometers thick and 0.6 micrometers thick. In the exemplary embodiment, the layer of aluminum is approximately 0.5 micrometers thick. In the exemplary embodiment, layer 550 includes a layer of titanium dioxide approximately 500 angstroms thick and a layer of aluminum 0.5 micrometers thick. The thickness range is provided for illustration purposes and is not intended to suggest a limitation. Layer 550 covers layer 548 and extends to the edge of layer 548 on dam 530.

An optional moisture barrier layer 552 is deposited on layer 550 when used. Layer 552 covers layer 550 and extends past the edge of layer 550 onto dam 530. In one embodiment, layer 552 includes a layer of titanium dioxide in a range of between 300 angstroms and 700 angstroms thick. In an alternative embodiment, layer 552 is in a range of between 400 angstroms and 600 angstroms thick. In the exemplary embodiment, layer 552 is approximately 500 angstroms thick. The thickness range is provided for illustration purposes and is not intended to suggest a limitation.

The above described hermetic seal covers for a x-ray detector panel are described in an exemplary fashion. A different number and ordering of layers of hermetic covering are contemplated to accommodate conditions or requirements of an end user.

In the exemplary embodiment, hermetic seal configuration 500 is not used with end channel 304 and protective cover 308. In an alternative embodiment, hermetic seal configuration 500 is covered with end channel 304 and protective cover 308 as illustrated in FIG. 4. In another alternative embodiments hermetic seal configuration 500 is covered with end channel 304 and protective cover 308 as illustrated in FIG. 5.

The above-described deposited hermetic cover for a digital X-ray panel is cost effective and highly reliable. The deposited hermetic covers include a plurality of deposited layers and a plurality of sealing edges. Additionally, an optional protective cover is provided to facilitate reducing damage to the detector from objects impinging on its surface. As a result, the deposited hermetic cover facilitates reducing moisture from damaging the detector components in a cost effective and reliable manner.

Exemplary embodiments of deposited hermetic covers are described above in detail. The covers are not limited to the specific embodiments described herein, but rather, components of the cover may be utilized independently and separately from other components described herein. Each deposited hermetic cover component can also be used in combination with other deposited hermetic cover components.

While the invention has been described in terms of various specific embodiments, those skilled in the art will recognize that the invention can be practiced with modification within the spirit and scope of the claims.

What is claimed is:

1. A method of fabricating an X-ray detector panel assembly including a detector substrate including a detector base surface and a plurality of sidewalls extending perpendicularly away from the detector base surface, the method comprising:
    forming a detector matrix on the detector substrate;
    forming a dam on the detector substrate circumscribing the detector matrix;
    forming a scintillator material on the detector matrix; and
    forming a hermetic covering on the scintillator material wherein the hermetic cover at least one of extends to a surface of the dam, and extends past the dam, forming the hermetic covering comprising forming a first encapsulating layer on the scintillator material extending to a surface of the dam; forming a reflective layer on the first encapsulating layer extending to an area between the detector matrix and the surface of the dam; forming a second encapsulating layer on the reflective layer extending to an edge of the first encapsulating layer on the surface of the dam; forming a first moisture barrier layer on the second encapsulating layer extending to an edge of the second encapsulating layer on the surface of the dam; determining if a second moisture barrier layer will be formed on the first moisture barrier layer; and forming a second moisture barrier layer on the first moisture barrier layer, the second moisture barrier layer extending past the first moisture barrier layer onto a surface of the dam based on the determination.

2. A method in accordance with claim 1 wherein forming a reflective layer comprises:
    forming a first layer comprising at least one of silver, gold, and chrome;
    forming a second layer comprising titanium dioxide; and
    forming a third layer comprising aluminum.

3. A method in accordance with claim 1 wherein forming a first moisture barrier layer comprises:
    forming a first layer comprising titanium dioxide; and
    forming a second layer comprising aluminum.

4. A method in accordance with claim 1 wherein forming a second moisture barrier layer comprises forming a first layer comprising aluminum.

5. A method in accordance with claim 1 wherein forming the scintillator material comprises forming a layer of cesium iodide crystals configured as standing needlelike structures extending from the detector matrix.

6. A method in accordance with claim 1 wherein forming the hermetic covering comprises:
    forming an encapsulating coating on the scintillator material extending past the dam;
    forming a reflective layer on the encapsulating coating extending past the dam; and
    forming a thin film mask on the reflective layer extending past the dam.

7. A method in accordance with claim 6 wherein forming an encapsulating coating comprises forming an encapsulating coating that extends between a plurality of needlelike structures of scintillator material, coating the needlelike structure surfaces.

8. A method in accordance with claim 6 wherein forming a hermetic covering further comprises:
    forming a hermetic layer on the thin film mask extending past the dam and extending past the thin film mask; and
    forming a corrosion protection layer on the hermetic layer extending past the dam and extending past the hermetic layer.

9. A method in accordance with claim 6 wherein the detector base surface includes a chest wall side, and wherein forming a hermetic covering further comprises:
    forming a hermetic layer on the thin film mask extending past the dam and extending onto at least one sidewall adjacent to the chest wall side; and
    forming a corrosion protection layer on the hermetic layer extending past the dam and extending onto at least one sidewall adjacent to the chest wall side.

10. A method in accordance with claim 6 wherein the detector base surface includes an opposing backside and a chest wall side, and wherein forming a hermetic covering further comprises:
    forming a hermetic layer on the thin film mask extending past the dam;
    forming a corrosion protection layer on the hermetic layer extending past the dam; and
    coupling an end channel to at least one sidewall.

11. A method in accordance with claim 10 wherein coupling an end channel comprises coupling an end channel to the chest wall side.

12. A method in accordance with claim 11 further comprising coupling a mechanical cover between the hermetic layer and the end channel such that there is a gap between the hermetic layer and the end channel.

13. A method in accordance with claim 11 further comprising coupling a mechanical cover between the corrosion protection layer and the end channel such that there is a gap between the corrosion protection layer and the end channel.

14. A method in accordance with claim 11 further comprising coupling a mechanical cover to the end channel exterior covering the hermetic layer such that there is a gap between the hermetic layer and the end channel.

15. A method in accordance with claim 11 further comprising coupling a mechanical cover to the end channel exterior covering the corrosion protection layer such that there is a gap between the corrosion protection layer and the end channel.

* * * * *